United States Patent [19]
Matsunaga et al.

[11] Patent Number: 6,052,517
[45] Date of Patent: Apr. 18, 2000

[54] SPHERICAL CELL DESIGN FOR VLSI CIRCUIT DESIGN ON A SPHERICAL SEMICONDUCTOR

[75] Inventors: Eiji Matsunaga, Lewisville, Tex.; Nobuo Takeda, Sendai, Japan

[73] Assignee: Ball Semiconductor, Inc., Allen, Tex.

[21] Appl. No.: 09/107,875

[22] Filed: Jun. 30, 1998

[51] Int. Cl.[7] .............................. G06F 17/50; G06F 19/00; G06F 17/00

[52] U.S. Cl. ................................ 395/500.09; 395/500.21; 395/500.23; 395/500.01; 700/98; 345/420; 345/425; 345/427

[58] Field of Search .......................... 395/500.01–500.23; 700/98; 345/420, 425, 427

[56] References Cited

U.S. PATENT DOCUMENTS

| | | | |
|---|---|---|---|
| 5,361,385 | 11/1994 | Bakalash | 345/424 |
| 5,367,465 | 11/1994 | Tazawa et al. | 700/98 |
| 5,416,729 | 5/1995 | Leon et al. | 395/500.21 |
| 5,644,688 | 7/1997 | Leon et al. | 345/420 |
| 5,661,663 | 8/1997 | Scepanovic et al. | 395/500.09 |
| 5,802,290 | 9/1998 | Casselman | 709/201 |
| 5,901,252 | 5/1999 | Kawakami et al. | 382/276 |

OTHER PUBLICATIONS

Ball Semiconductor Achieves Expermential Breakthrough for Building Electronic Devices on Sphere, PR Newswire, p. 625DATH018, Jun. 25, 1998.

Brown, "Work on EL microspheres may help the development of photonic crystals—Research rolling on spherical lasers", Electronic Engineering Times, No. 949, p. 35 (3 pages), Apr. 14, 1997.

Bruner, "'Spherical' Chip–Making Technology is Explored", Electronic News (1991), p. 60 (2 pages), Apr. 28, 1997.

PR Newswire, "BALL Semiconductor Achieves Experimental Breakthrough for Building Electronic Devices on Sphere", PR Newswire, p. 625DATH018 (3 pages), Jun. 25, 1998.

*Primary Examiner*—Kevin J. Teska
*Assistant Examiner*—Phallaka Kik
*Attorney, Agent, or Firm*—Haynes and Boone, L.L.P.

[57] ABSTRACT

A method for designing a circuit on a spherical shaped semiconductor integrated circuit using uniform unit shapes capable of cover the surface of the sphere in a matingly corresponding orientation with adjacent unit shapes. The method includes the steps of designing a circuit within each unit shape selected from various types of unit shape patterns; selecting a predetermined number of those unit shapes from the various types of unit shape patterns; and covering the spherical integrated circuit with the predetermined number of unit shapes. Furthermore, the designer can use the unit shapes to navigate over the surface to accurately determine the location, the position, and surface area remaining.

21 Claims, 7 Drawing Sheets

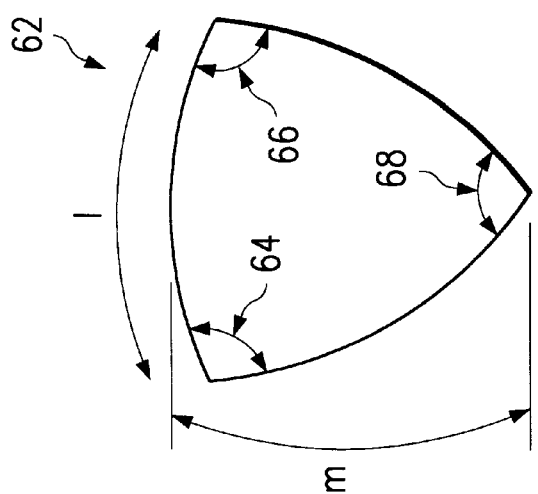
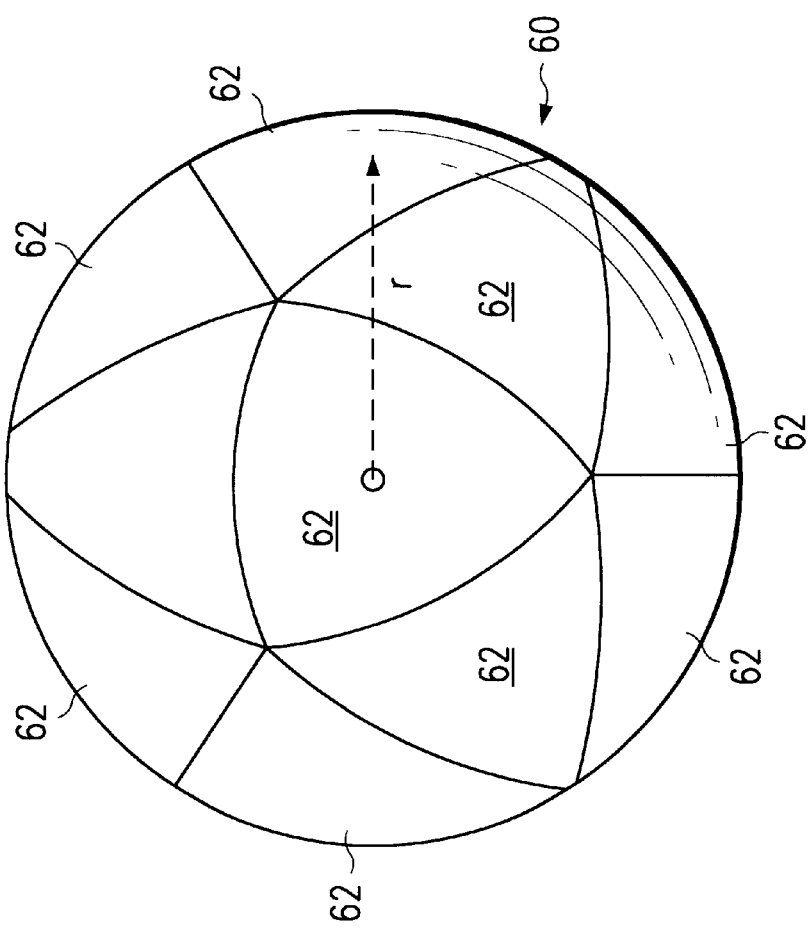
Fig. 6
Fig. 5

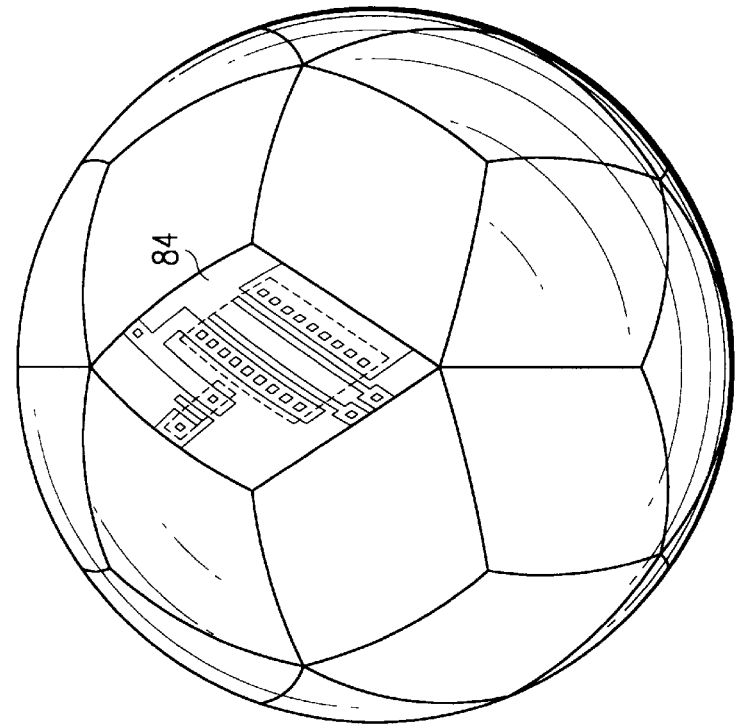
Fig. 9
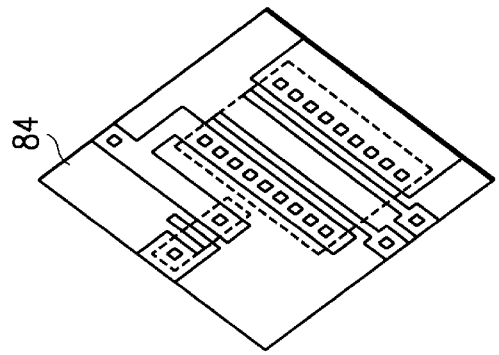
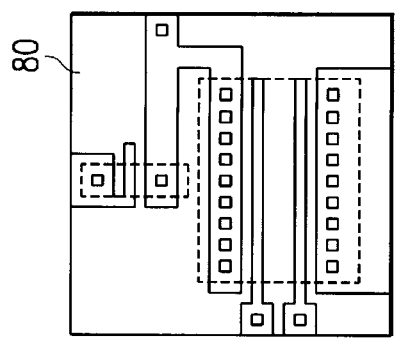

ially, VLSI circuit designs
SPHERICAL CELL DESIGN FOR VLSI CIRCUIT DESIGN ON A SPHERICAL SEMICONDUCTOR

BACKGROUND OF THE INVENTION

The invention relates generally to fabrication of semiconductor devices, and more particularly, to unit shapes used in very large scale integration (VLSI) circuit design on a spherical semiconductor device.

Conventional integrated circuits, or "chips," are formed from two dimensional or flat surface semiconductor wafers. The semiconductor wafer is first manufactured in a semiconductor material manufacturing facility and is then provided to a fabrication facility. At the latter facility, several layers are processed onto the semiconductor wafer surface using various design concepts, such as VLSI design. Although the processed chip includes several layers fabricated thereon, the chip still remains relatively flat.

A fabrication facility is relatively expensive due to the enormous effort and expense required to create flat silicon wafers and chips. For example, manufacturing the wafers requires several high-precision steps including creating rod-form polycrystalline semiconductor material; precisely cutting ingots from the semiconductor rods; cleaning and drying the cut ingots; manufacturing a large single crystal from the ingots by melting them in a quartz crucible; grinding, etching, and cleaning the surface of the crystal; cutting, lapping and polishing wafers from the crystal; and heat processing the wafers. Moreover, the wafers produced by the above processes typically have many defects which are largely attributable to the difficulty in making a single, highly pure crystal due to the above cutting, grinding and cleaning processes as well as due to the impurities, including oxygen, associated with containers used in forming the crystals. These defects become more and more prevalent as the integrated circuits formed on these wafers become smaller.

Another major problem associated with modern fabrication facilities for flat chips is that they require extensive and expensive equipment. For example, dust-free clean rooms and temperature-controlled manufacturing and storage areas are necessary to prevent the wafers and chips from defecting and warping. Also, these types of fabrication facilities suffer from a relatively inefficient throughput as well as an inefficient use of the silicon. For example, facilities using in-batch manufacturing, where the wafers are processed by lots, must maintain huge inventories to efficiently utilize all the equipment of the facility. Also, because the wafers are round, and the completed chips are rectangular, the peripheral portion of each wafer cannot be used.

Still another problem associated with modern fabrication facilities is that they do not produce chips that are ready to use. Instead, there are many additional steps that must be completed, including cutting and separating the chip from the wafer; assembling the chip to a lead frame which includes wire bonding, plastic or ceramic molding and cutting and forming the leads, positioning the assembled chip onto a printed circuit board; and mounting the assembled chip to the printed circuit board. The cutting and assembly steps introduce many errors and defects due to the precise requirements of such operations. Additionally, the positioning and mounting steps are naturally two-dimensional in character, and therefore do not support curved or three-dimensional areas.

There are numerous problems associated with applying a two-dimensional circuit design to a three-dimensional object, such as a sphere. Specifically, VLSI circuit designs for flat chips are achieved by using two-dimensional based computer aided circuit design tools. However, these conventional methods of VLSI circuit design are not suitable for three-dimensional surfaces because modifying a two dimensional design to fit onto a three-dimensional curved surface results in two problems. First, a two-dimensional design element, such as a line or shape, is deformed when fitted over a three-dimensional curved surface. This deformation results in distortion of the circuit design, which results in unacceptable circuit elements. Second, in two-dimensional circuit VLSI design, square and/or rectangular design units are used to modularize the design for ready transformation onto a two-dimensional surface. However, these conventional units do not fit properly onto a curved surface, such as a sphere. As a result, the distribution of the units on the sphere results in random and inefficient use of the sphere's surface area. Furthermore, the designer can not easily navigate over the surface of the sphere to determine location, direction, and space or surface area remaining.

Therefore, what is needed is a method of designing a circuit on a three-dimensional object, such as a sphere, using a predetermined number of uniform unit shapes that are capable of covering the entire surface area of the sphere, thereby eliminating wasted and unused surface area.

SUMMARY OF THE INVENTION

The present invention, accordingly, provides a method for designing a circuit on a spherical shaped semiconductor integrated circuit using uniform unit shapes that cover the entire surface of the sphere to allow reliable navigation by the designer. The spherical shaped semiconductor integrated circuit, hereinafter "spherical IC", replaces the function of the flat, conventional chip. To this end, the method for designing an integrated circuit on the surface of a spherical semiconductor device includes the steps of designing a circuit within each or some unit shape of a uniform unit shapes; selecting a uniform unit shape from three types of uniformed unit shape patterns; and covering the spherical IC with uniform unit shapes.

An advantage of the present invention is that the uniform unit shapes will be geometrically equivalent on a sphere and capable of covering the entire surface of the spherical IC without leaving any void space.

Another advantage of the present invention is that by using the uniform unit shapes, a designer will be able to easily navigate over the surface of the sphere. The uniform unit shapes in effect act as a navigating aid that tells the designer location, direction, and surface area or space remaining while the designer draws a circuit design on the spherical IC.

Another advantage of the present invention is that it results in an ability to generate a variety of circuit designs within unit shapes by making one-to-one grid mapping from conventional two-dimensional circuit designs within a square into three-dimensional circuit design within a unit shape.

DEFINITIONS

Sphere

The set of all points P in space whose distance r is called the sphere of radius R and center O. A sphere is a surface and not a solid body, although it encloses a solid body, which is properly called interior of the sphere; in particular, the center of a sphere is not a point of the sphere but is a point of the interior of the sphere.

Great Circle

The section of the sphere made by a plane passing through the center of the sphere is called a great circle (Geodesics) of the sphere.

Minor Arc

The two points divide this great circle into two arcs the smaller of which is called the minor arc of the points.

Poles

The poles (antipodal) of a circle of the sphere are the extremities of the axis of the circle.

Spherical Distance

The spherical distance between any two points on a sphere is the length of the smaller arc of the great circle passing through the points. If the two arcs are equal, either may be taken to represent the distance. The spherical distance is generally measured in arc degrees of a great circle of the sphere. The spherical distance between any two points is a quadrant means that it is one quarter of the arc of a great circle.

Spherical Angle

A spherical angle is formed by two arcs of great circles drawn or originating from a point on a sphere. The point from which the arcs are drawn is the vertex of the angle, and the arcs are the sides of the angle. A spherical angle is measured by the plane angle which is formed by the tangents to its sides at the vertex.

Spherical Polygon

A spherical polygon is a closed figure formed by three or more arcs of great circles.

Spherical Triangle

A spherical triangle is a spherical polygon of three sides. Spherical triangle is composed of three points of the sphere, not all on the same great circle, together with the minor arcs.

BRIEF DESCRIPTION OF THE DRAWINGS

FIG. 5 illustrates a sphere with radius r having twenty unit spherical angles.

FIG. 6 illustrates one of the twenty unit spherical triangles of FIG. 5 with angle dimension representation.

FIG. 9 illustrates one-to-one mapping a two-dimensional circuit design in a square into a unit shape and onto a spherical IC.

DESCRIPTION OF THE EMBODIMENTS

Figure 2:
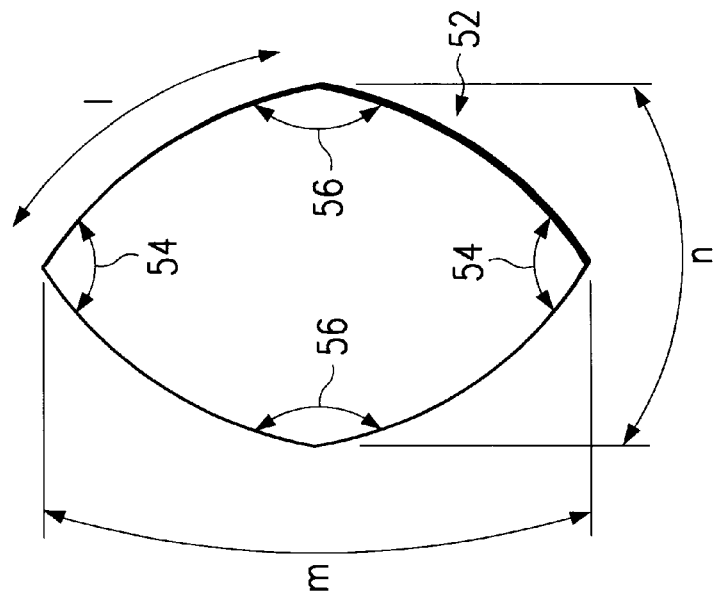
FIG. 2 illustrates one of the twelve unit spherical lozenges of FIG. 1 with angle dimension representation.
Figure 1:
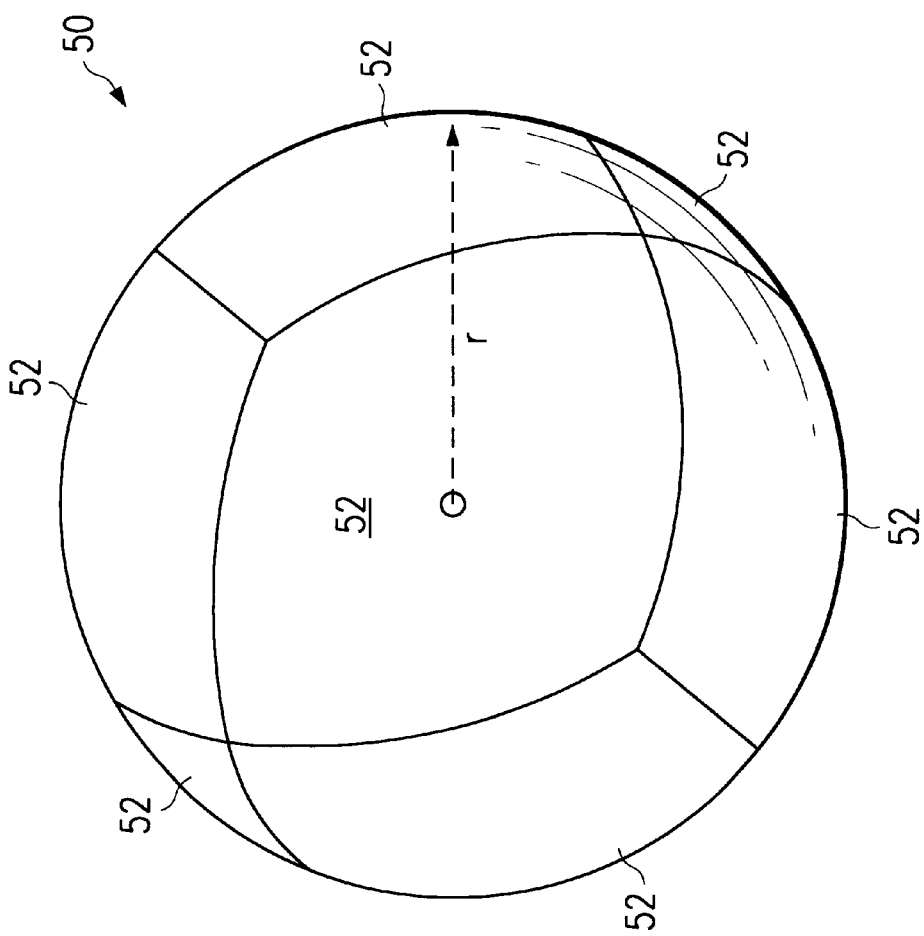
FIG. 1 illustrates a sphere with radius r having twelve unit spherical lozenges.

In one embodiment of the present invention, as shown in FIGS. 1 and 2, the reference numeral 50 refers, in general, to a spherical semiconductor device, hereinafter the "spherical IC", with a predetermined radius r. The spherical IC 50 is shown with twelve (12) unit spherical lozenges or unit shapes, each designated 52. By way of example and to avoid confusion, the details for only one of the unit shapes 52 is discussed. However, it is apparent that the discussion relates to all of the unit shapes 52 because the unit shapes 52 are designed such that all sides of each of the unit shapes 52 are of equal length or spherical distance. As shown in FIG. 2, lengths l, m, and n of each of the sides, longer diagonal, and shorter diagonal, respectively, of the unit shape 52 have a predetermined relationship to the radius r of the sphere represented according to the following equations:

$$2\pi r = 4m = 4l + 2n \quad \text{equation 1}$$

$$n = 2r\text{ArcSin}\left[\frac{1}{\sqrt{3}}\right] \quad \text{equation 2}$$

The qualities of the unit shape 52 are such that if the unit shape 52 was repeated twelve times and placed in a matingly corresponding orientation with respect to other unit shapes on the spherical IC 50, then the entire surface of the spherical IC 50 would be completely covered using only whole unit shapes 52.

Another, feature of the unit shape 52 is that opposite corners of the unit shape 52 have the same spherical angle. Thus, spherical angles 54 and 56 are defined, using equations (1) and (2), as follows:

angles 54=$\pi/2$ and angles 56=$2\pi/3$.

In order to locate the unit shapes 52 on the spherical IC 50, the designer must select the orientation for the placement of a first unit shape 52. Then all other unit shapes 52 are placed on the spherical IC 50 in the matingly corresponding orientation. Specifically, each side of one unit shape 52 is aligned and mated with a corresponding side of a different unit shape 52. The matingly corresponding alignment process is repeated for additional unit shapes 52 until the desired portion or the entire surface of the spherical IC 50 is covered.

Figure 3:
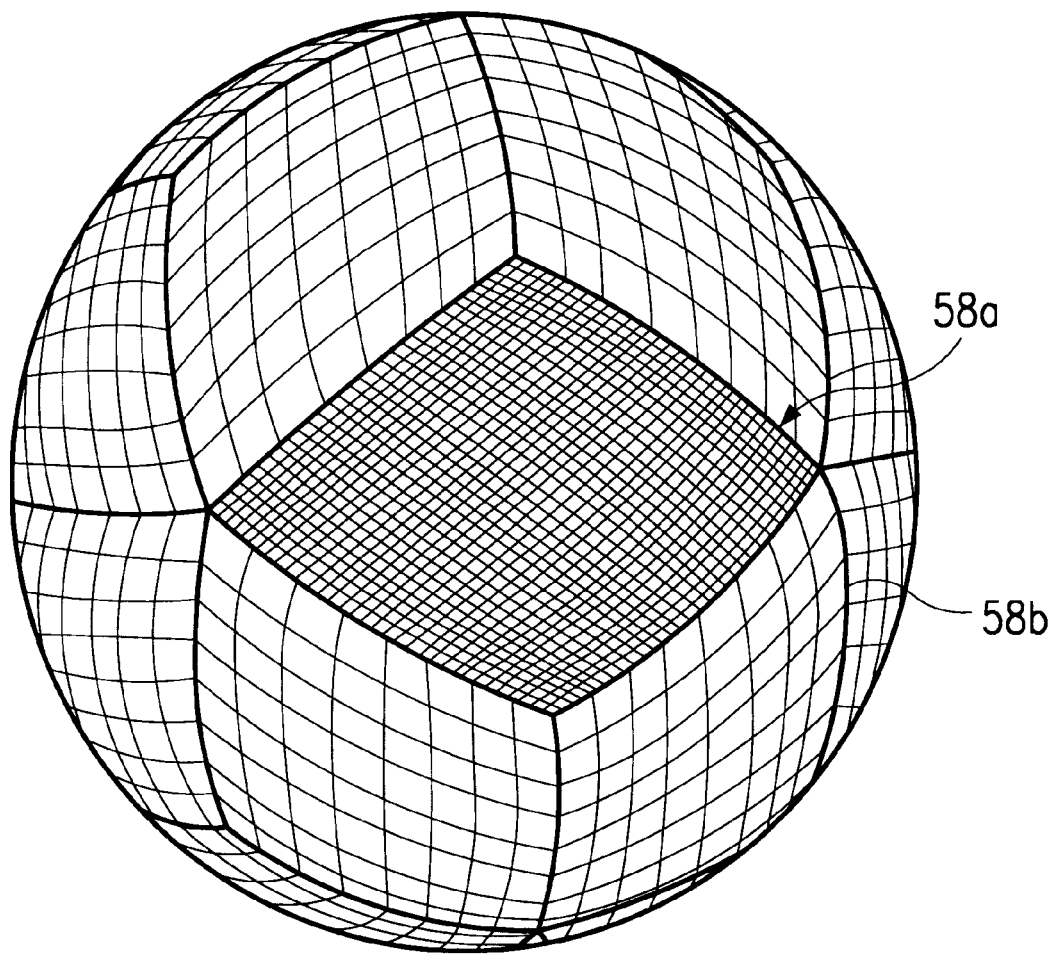
FIG. 3 illustrates a spherical IC with unit shapes having various grids in each unit shape.

Referring to FIG. 3, using the unit shape 52, a designer can develop a variety of circuit designs, such as unit shapes 58a and 58b, within the boundary of the unit shapes 58a or 58b to produce unit shape circuit designs for mapping from a two dimensional design onto the spherical IC. Accordingly, the unit shape is divided into grids so that the designer can implement a circuit design for the spherical IC 50 using a one-to-one correspondence from the two-dimensional design to the grids of the unit shape. Using the unit shape, the designer may design one or more specific circuits within the grids of the unit shape.

Figure 4C:
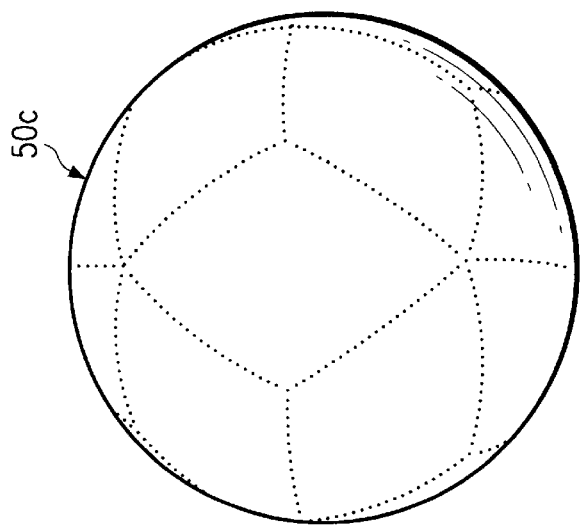
FIG. 4 illustrates various spheres wherein each sphere has unit shapes used in navigation and surface area determination.
Figure 4B:
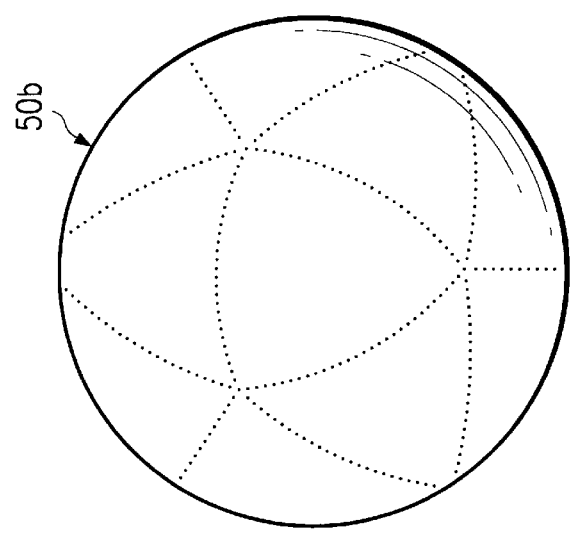
Figure 4A:
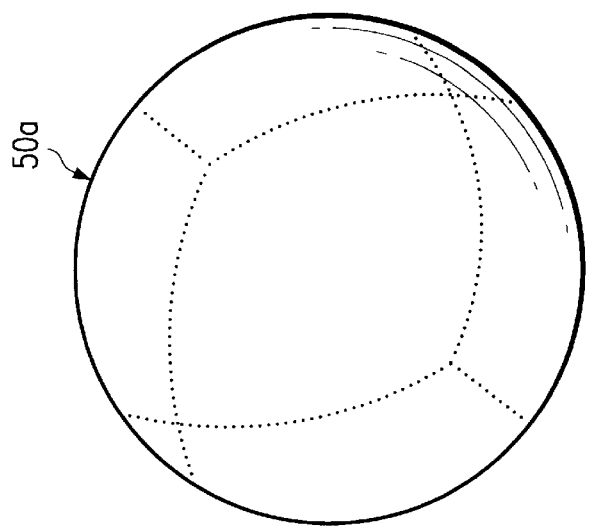

Referring to FIG. 4, the unit shapes in each of the spherical ICs 50a, 50b, or 50c act as a lay-out-tool or navigator for the designer. Using the boundary lines of each unit shape, the designer can navigate over the surface of the spherical IC. When a select number of the unit shapes, for example four unit shapes, have been placed on the spherical IC, the designer can readily determine how much surface area remains on the spherical IC. Furthermore, given the condition that each of the unit shapes have a unique location and orientation on the surface of the spherical IC, the designer can easily navigate over the surface of the spherical IC.

In another embodiment of the present invention, shown in FIGS. 5 and 6, the reference numeral 60 refers, in general, to a spherical IC with a predetermined radius r. The spherical IC 60 is shown with twenty (20) unit spherical triangles or unit shapes, each designated 62. By way of example and to avoid confusion, details for only one of the unit shapes 62 is discussed. However, it is apparent that the discussion relates to all of the unit shapes 62 because the unit shapes are designed such that all sides of each of the unit shapes 62 are of equal length or spherical distance l. As shown in FIG. 2, lengths l and m of each of the sides and diagonals, respectively, of the unit shape 62 have a predetermined relationship to the radius r of the spherical IC 60 represented according to the following equations:

$$2\pi r = 4m + 2l \qquad \text{equation 3}$$

$$l = 2r\text{ArcSin}\left[\frac{1}{2}\sqrt{2 - \frac{2}{\sqrt{5}}}\right] \qquad \text{equation 4}$$

The qualities of the unit shape 62 are such that if the unit shape 62 was repeated twenty times and placed in a matingly corresponding orientation on the spherical IC 60, then the entire surface of the spherical IC 60 would be completely covered using only whole unit shapes 62.

Another, feature of the unit shape 62 is that corners of the unit shape 62 have the same spherical angle. Thus, spherical angles 64, 66, 68 are the same. In particular, the spherical angles are defined as follows:

angles 64, 66, and 68=$2\pi/5$

In order to locate the unit shapes 62 on the spherical IC 60, the designer selects the orientation and location for the placement of a first unit shape 62. Then all other unit shapes 62 are placed on the spherical IC 60 in the matingly corresponding orientation. Specifically, each side of one unit shape 62 is aligned and mated with a corresponding side of a different unit shape 62. The matingly corresponding alignment process is repeated for additional unit shapes 62 until the desired portion or the entire surface of the spherical IC 60 is covered.

As discussed above, using one of the unit shapes 62, a designer can develop a variety of circuit designs within the boundary of the unit shapes 62 to produce triangle unit shaped circuit designs. Accordingly, the unit shape 62 is established so that a circuit designer can implement a circuit design for the spherical IC 60.

In a similar manner as the embodiment in FIG. 1, one of the unit shapes 62 can easily replace another to change the semiconductor characteristics of the spherical IC 60. Furthermore, the unit shapes 62 act as a lay-out-tool or navigator for the designer. When a selected number of the unit shapes 62, for example four unit shapes, have been placed on the spherical IC 60, the designer can readily determine how much surface area remains on the spherical IC 60. Also, given the condition that each of the unit shapes 62 has a unique location and orientation on the surface of the spherical IC 60, the designer can easily navigate over the surface of the spherical IC 60.

Figure 8:
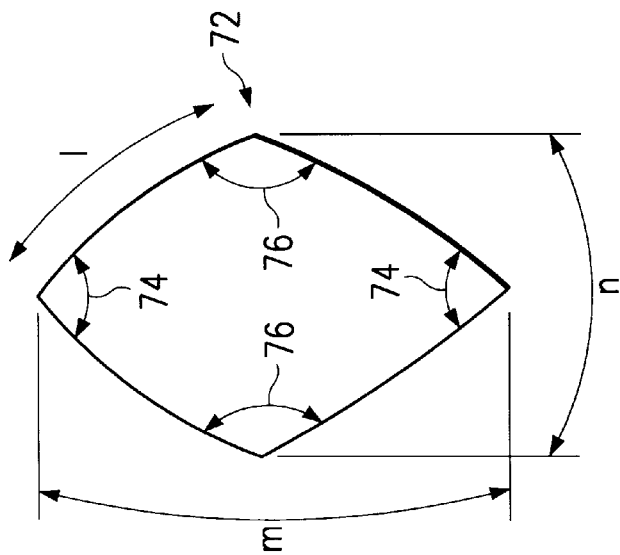
FIG. 8 illustrates one of the thirty unit spherical lozenges of FIG. 7 with angle dimension representation.
Figure 7:
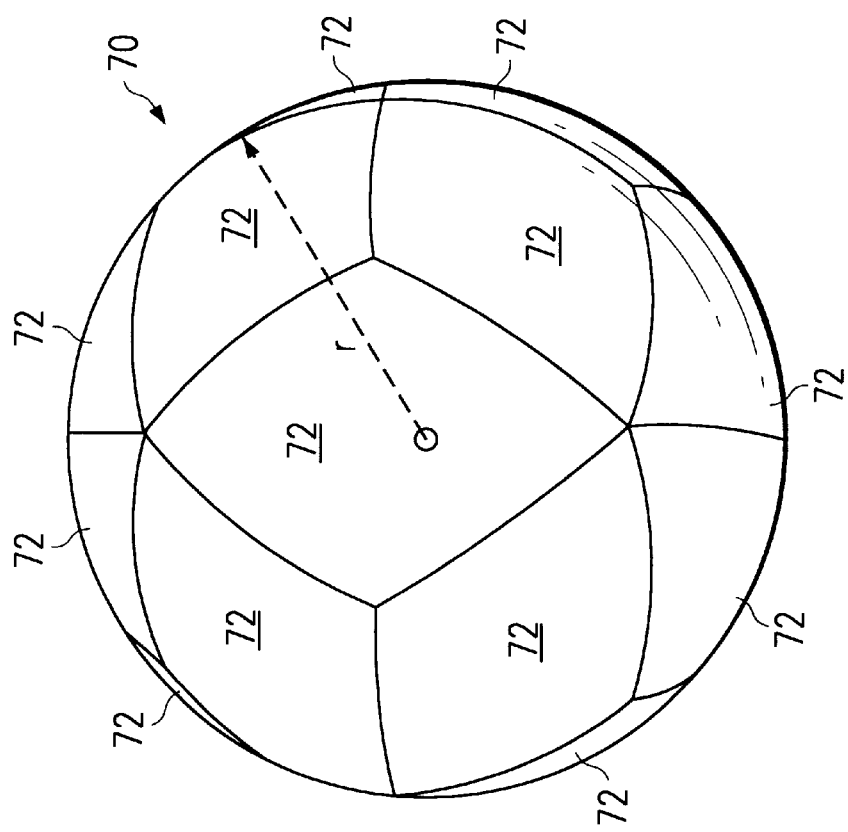
FIG. 7 illustrates a sphere with radius r having thirty unit spherical lozenges.

In another embodiment of the present invention, shown in FIGS. 7 and 8, the reference numeral 70 refers, in general, to a spherical IC with a predetermined radius r. The spherical IC 70 is shown with thirty (30) unit spherical lozenges or unit shapes, each designated 72. By way of example and to avoid confusion, details for only one of the unit shapes 72 is discussed. However, it is apparent that the discussion relates to all of the unit shapes 72 because all sides of each of the unit shapes 72 are of equal length or spherical distance l. Furthermore, as shown in FIG. 8, lengths l, n, and m of each of the sides, short diagonal, and long diagonal, respectively, of the unit shape 72 have a predetermined relationship to the radius r of the spherical IC 70 represented according to the following equations:

$$2\pi r = 4l + 2m + 2n \qquad \text{equation 5}$$

$$n = 2r\text{ArcSin}\left[\frac{1}{2}\sqrt{2 - \frac{2\sqrt{5}}{3}}\right] \qquad \text{equation 6}$$

$$l = 2r\text{ArcSin}\left[\frac{1}{2}\sqrt{2 - \sqrt{\frac{1}{30}(5+\sqrt{5})} - \sqrt{\frac{1}{6}(5+\sqrt{5})}}\right] \qquad \text{equation 7}$$

The qualities of the unit shape 72 are such that if the unit shape 72 was repeated thirty times and placed in a matingly corresponding orientation on the spherical IC 70, then the entire surface of the spherical IC 70 would be completely covered using only whole unit shapes 72.

Another, feature of the unit shape 72 is that opposite corners of the unit shape 72 have the same spherical angle. Thus, spherical angles 74 and 76 are defined as follows:

angles 74=$2\pi/5$ angles 76=$2\pi/3$

Similar to the embodiments set forth in FIGS. 1 and 5, the designer selects the location and orientation for placement of a first unit shape 72. Then all other unit shapes 72 are placed on the surface of the spherical IC 70 in the matingly corresponding orientation. Specifically, each side of one unit shape 72 is aligned and mated with a corresponding side of a different unit shape 72. The matingly corresponding alignment process is repeated for additional unit shapes 72 until the desired portion or the entire surface of the spherical IC 70 is covered.

Using one of the unit shapes 72, a designer can develop a variety of circuit designs within the boundary of the unit shapes 72 to produce unit shaped circuit designs. Accordingly, the unit shape 72 is established so that a circuit designer can implement a circuit design for the spherical IC 70. In a similar manner as other embodiments, one of the unit shapes 72 can easily replace another to change the semiconductor characteristics of the spherical IC 70.

Furthermore, similar to the embodiments of FIGS. 1 and 5, the unit shapes 72 act as a navigational tool for the designer as shown in and discussed with respect to FIG. 4.

Referring now to FIG. 9, a circuit 80 is shown redesigned within a unit shape, such as unit shape 52 or the unit shape 72, using one-to-one corresponding mapping of grids to produce a circuit 84. The unit shape is placed on a spherical IC, such as spherical ICs 50 or 70. A variety of different unit shape circuit designs can be combined to produce any desired integrated semiconductor VLSI characteristic for the spherical IC.

Figure 10:
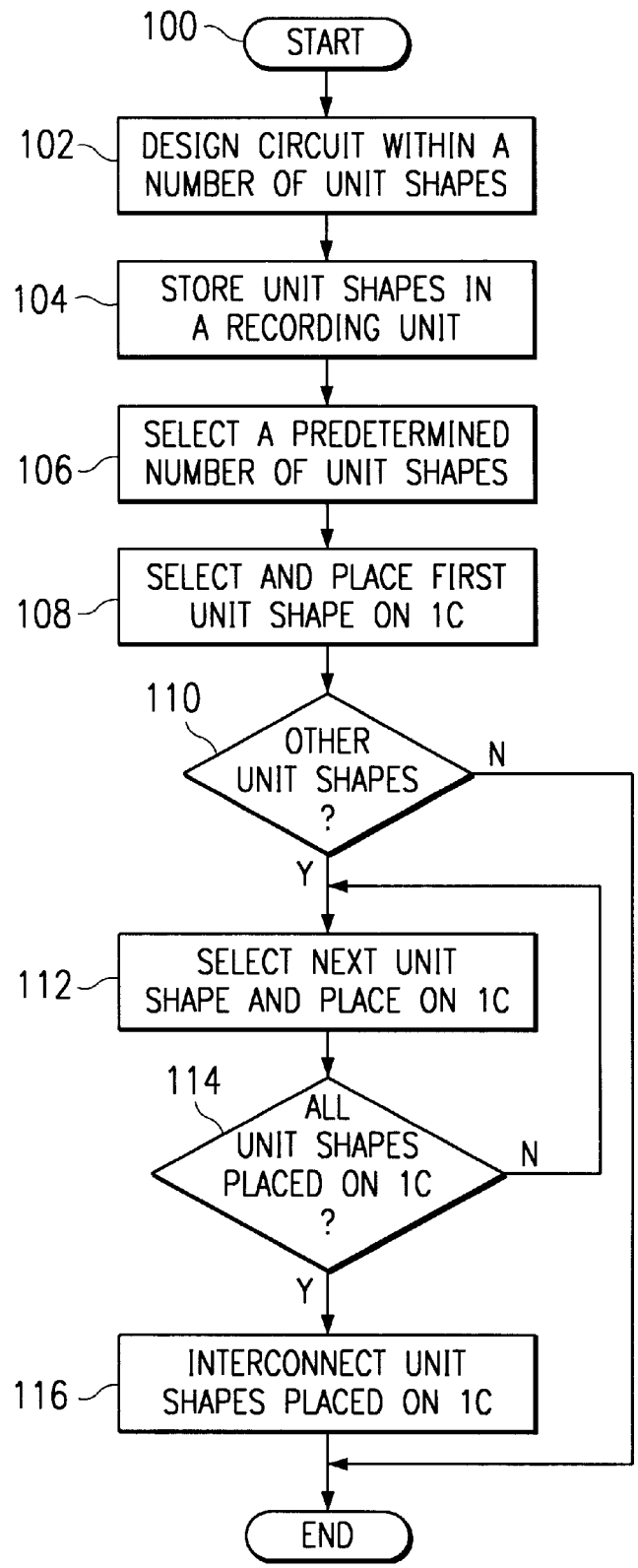
FIG. 10 is a flowchart for mapping from two-dimension onto the spherical IC.

FIG. 10 provides one example of the process for imposing circuit components onto the surface of the spherical IC beginning at step 100. At step 102, the circuit components are designed within the unit shapes using one-to-one correspondence of the grid, such as the unit shapes 52, 62, or 72, to create unit shape circuit designs, wherein each unit shape circuit design has a unique characteristic. At step 104, the unit shape circuit designs generated at step 102 are stored for later retrieval. At step 106, the designer selects a predetermined number of the unit shapes. The number of unit shapes selected can vary from a maximum number required to cover the entire surface of the spherical IC to just one unit shape. At step 108, a first unit shape, such as unit shapes 52, 62, or 72, is located on the spherical IC 10 and a circuit design is processed thereon. The first unit shape can be located in any orientation on the spherical IC. At step 110, it is determined whether there are other unit shape circuit designs to place on the spherical IC so that the combined circuit designs will produce a larger circuit. If other unit shapes do not need to be placed on the spherical IC, the process ends. Otherwise, at step 112, the next unit shape and circuit design is selected and placed on the spherical IC 10 in a matingly corresponding orientation to the other unit shapes. At step 114, if there are other unit shapes to be placed on the spherical IC, then the process returns to step 112. If there are no other unit shapes to be placed on the spherical IC then the process proceeds to step 116 where the spherical IC is fabricated to create an integrated spherical semiconductor device.

It is understood that several modifications, changes and substitutions are intended in the foregoing disclosure and in some instances some features of the invention will be employed without a corresponding use of other features. For example, certain circuit designs may require multiple unit shapes arranged in various fashions. Also, in some integration designs it may be advantageous to interconnect each unit shape, to other unit shapes already on the spherical IC, as it is placed on the spherical IC, instead of waiting until all the unit shapes are placed onto the spherical IC. Accordingly, it is appropriate that the appended claims be construed broadly and in a manner consistent with the scope of the invention.

What is claimed is:

1. A program product for implementing a circuit design on the surface of a spherical semiconductor device comprising:

instructions stored on a recording unit for generating a plurality of unit shape circuit designs each arranged within one unit shape of a plurality of unit shapes, wherein each unit shape circuit design is capable of being placed on the device and wherein each unit shape has a plurality of sides of equal length; and instructions stored on the recording unit for matingly arranging a predetermined number of unit shapes selected from the plurality of unit shape circuit designs on the surface of the device, wherein the predetermined number of unit shapes are capable of covering the entire surface of the device.

2. The program product of claim 1 wherein the predetermined number of unit shapes is twelve.

3. The program product of claim 1 wherein the predetermined number of unit shapes is thirty.

4. The program product of claim 1 wherein the predetermined number of unit shapes is twenty.

5. The program product of claim 4 wherein the plurality of unit shapes are spherical triangles.

6. The program product of claim 1 wherein the predetermined number of unit shapes is the exact number needed to cover the entire surface of the device.

7. The program product of claim 1 wherein the predetermined number of unit shapes cover only a portion of the device.

8. The program product of claim 1 wherein each unit shape has a defined boundary geometrically identical to all of the other plurality of unit shapes.

9. The program product of claim 8 wherein at least a portion of the unit shape circuit design extends to the unit shape boundaries.

10. The program product of claim 1 wherein the predetermined number of unit shapes are arranged in a matingly corresponding orientation to a first unit shape selected from the plurality of unit shapes.

11. The program product of claim 1 wherein the unit shapes are used to navigate over the surface of the device.

12. The program product of claim 1 wherein the length of each side of each unit shape has a predetermined relationship to a radius of the device.

13. The program product of claim 1 wherein the predetermined number of unit shapes placed on the device help determine the remaining un-used surface area of the device.

14. A method for designing an integrated circuit on the surface of a spherical semiconductor device, the method comprising the steps of:

designing a circuit within a predetermined number of unit shapes of a plurality of unit shapes;

selecting from the predetermined number of unit shapes; and covering the device with the selected predetermined number of unit shapes.

15. The method of claim 14 wherein the step of covering comprises the steps of:

selecting a first location for a first unit shape selected from the predetermined number of unit shapes; and arranging other unit shapes selected from the predetermined number of unit shapes in a matingly corresponding position relative to the first unit shape.

16. The method of claim 15 wherein the predetermined number of unit shapes is the exact number required to cover the entire surface of the device.

17. The method of claim 15 wherein the predetermined number of unit shapes cover only a portion of the device.

18. The method of claim 14 wherein each unit shape has a plurality of sides of equal length and the length has a predetermined relationship to a radius of the device.

19. The method of claim 14 further comprising the steps of:

navigating over the surface of the device using the selected unit shapes located on the device; and determining the uncovered surface area remaining on the device using the located unit shapes.

20. The method of claim 14 wherein the predetermined number of unit shapes act as a navigation tool and determine the surface area of the device remaining.

21. The method of claim 14 wherein the designing step comprises the steps of:

dividing each unit shape into a plurality of grid squares; and mapping from a conventional two-dimensional circuit designed within a two-dimensional shape to the unit shape using the plurality of grid squares.

* * * * *